United States Patent
Cheng

(10) Patent No.: US 10,164,028 B2
(45) Date of Patent: Dec. 25, 2018

(54) THIN FILM TRANSISTOR, MANUFACTURING METHOD THEREFOR, OXIDE BACK PLATE AND DISPLAY APPARATUS

(71) Applicant: BOE Technology Group Co., Ltd., Beijing (CN)

(72) Inventor: Jun Cheng, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/547,863

(22) PCT Filed: Apr. 6, 2016

(86) PCT No.: PCT/CN2016/078539
§ 371 (c)(1),
(2) Date: Aug. 1, 2017

(87) PCT Pub. No.: WO2016/197679
PCT Pub. Date: Dec. 15, 2016

(65) Prior Publication Data
US 2018/0019312 A1    Jan. 18, 2018

(30) Foreign Application Priority Data

Jun. 12, 2015   (CN) .......................... 2015 1 0324773

(51) Int. Cl.
*H01L 27/00*    (2006.01)
*H01L 29/00*    (2006.01)
(Continued)

(52) U.S. Cl.
CPC ........ *H01L 29/41733* (2013.01); *H01L 21/34* (2013.01); *H01L 27/12* (2013.01);
(Continued)

(58) Field of Classification Search
CPC ........... H01L 29/41733; H01L 29/7869; H01L 29/66969; H01L 29/401; H01L 29/45;
(Continued)

(56) References Cited

U.S. PATENT DOCUMENTS 8,507,916 B2 * 8/2013 Misaki ................ H01L 27/1225
257/40
8,828,794 B2 * 9/2014 Yamazaki ........... H01L 29/7869
438/104
(Continued)

FOREIGN PATENT DOCUMENTS

| CN | 102870221 | 1/2013 |
| CN | 103928491 | 7/2014 |

(Continued)

OTHER PUBLICATIONS

Office Action from corresponding Chinese Application No. 201510324773.X, dated Aug. 1, 2017 (9 pages).
(Continued)

*Primary Examiner* — Nikolay Yushin
(74) *Attorney, Agent, or Firm* — Harness, Dickey & Pierce, P.L.C.

(57) ABSTRACT

Provided are a thin film transistor, a manufacturing method therefor, an oxide back plate and a display apparatus. The thin film transistor comprises: an oxide active layer (4) and source and drain electrodes (6a, 6b) connected to the oxide active layer (4), wherein the source and drain electrodes (6a, 6b) comprise a main portion (M) and a connective portion (C), the main portion (M) being isolated from the active layer (4), and being electrically connected to the active layer (4) via the connective portion (C), and an electrical resistivity of the connective portion (C) is greater than that of the main portion (M). In the thin film transistor provided above, since the main portions of the source and drain electrodes are not in contact with the oxide active layer, a metal with a (Continued)

relatively high electrical conductivity can be used as the source and drain electrodes, without having a relatively great impact on the electrical performance of the oxide active layer.

20 Claims, 4 Drawing Sheets

(51) Int. Cl.
*H01L 29/417* (2006.01)
*H01L 21/34* (2006.01)
*H01L 29/45* (2006.01)
*H01L 29/786* (2006.01)
*H01L 27/12* (2006.01)
*H01L 29/40* (2006.01)
*H01L 29/66* (2006.01)

(52) U.S. Cl.
CPC ........ *H01L 27/1225* (2013.01); *H01L 29/401* (2013.01); *H01L 29/417* (2013.01); *H01L 29/45* (2013.01); *H01L 29/66969* (2013.01); *H01L 29/786* (2013.01); *H01L 29/7869* (2013.01)

(58) Field of Classification Search
CPC ............... H01L 27/1225; H01L 27/124; H01L 27/1255
See application file for complete search history.

(56) References Cited

U.S. PATENT DOCUMENTS

| | | |
|---|---|---|
| 2010/0187538 A1 | 7/2010 | Koo et al. |
| 2011/0163311 A1 | 7/2011 | Akimoto et al. |
| 2011/0215385 A1 | 9/2011 | Yamazaki |
| 2012/0231580 A1* | 9/2012 | Yamazaki ........... H01L 29/7869 438/104 |
| 2013/0056729 A1 | 3/2013 | Misaki |
| 2014/0197382 A1 | 7/2014 | Kim et al. |

FOREIGN PATENT DOCUMENTS

| | | |
|---|---|---|
| CN | 104299913 | 1/2015 |
| CN | 104659106 | 5/2015 |
| CN | 105097942 | 11/2015 |
| TW | 201205809 | 2/2012 |

OTHER PUBLICATIONS

International Search Report from corresponding PCT Application No. PCT/CN2016/078539 dated Jul. 13, 2016 (2 pages).
Written Opinion from corresponding PCT Application No. PCT/CN2016/078539 dated Jul. 13, 2016 (4 pages).

* cited by examiner

THIN FILM TRANSISTOR, MANUFACTURING METHOD THEREFOR, OXIDE BACK PLATE AND DISPLAY APPARATUS

CROSS-REFERENCE TO RELATED APPLICATION

This application claims priority of Chinese Patent Application No. 201510324773.X filed on Jun. 12, 2015, the entire disclosure of which is incorporated herein by reference as a part of this application.

TECHNICAL FIELD

Embodiments of present disclosure relate to a thin film transistor, a manufacturing method therefor, an oxide back plate and a display apparatus.

BACKGROUND

A Thin Film Transistor Liquid Crystal Display (TFT-LCD) has characteristics such as small size, low power consumption and no radiation, and is prevailing in current market of flat panel display. The main structure of the TFT-LCD includes an array substrate and a color filter substrate that are cell-aligned, and a liquid crystal molecule layer filled between the array substrate and the color filter substrate. Based on different channel materials, TFTs in the prior art mainly includes two kinds, i.e., oxide semiconductor TFT (abbreviated as oxide TFT) and amorphous silicon TFT. The oxide TFT is more suitable for manufacturing high-end display products with high resolution (high definition) and high refresh rate (smoother motion graphics), because the oxide TFT has characteristics of a larger on-off current ratio, i.e., when it is turned on, the current is larger and the charging time is shorter; and when it is turned off, the leakage current is smaller and leakage is not easy to occur).

FIG. 1 is a structural schematic diagram of a typical oxide TFT. The oxide TFT comprises: a substrate 1, a gate electrode 2 formed on the substrate 1, a gate insulating layer 3 formed over the gate electrode 2, an active layer 4 formed over the gate insulating layer 3, source and drain electrodes 6a and 6b and an etching barrier layer 5 formed over the active layer 4 and the gate insulating layer 3, a passivation layer 7 formed over the source electrode and drain electrode 6a and 6b, and a pixel electrode 8 formed over the passivation layer 7, the pixel electrode 8 being connected with the drain electrode 6b through a via hole in the passivation layer 7. Such a structure has a problem that, in order to improve the response speed of the oxide TFT, it is necessary to use a metal having a relatively high electrical conductivity as the source and drain electrodes, while diffusion ability of conductive particles in the metal having a relatively high electrical conductivity is strong and the conductive particles may easily diffuse into the oxide active layer 4 and affect the electrical performance of the oxide active layer 4. When such an oxide TFT is used in a display product, it will affect the display performance of the corresponding display product.

SUMMARY OF THE INVENTION

The present disclosure provides a novel thin film transistor structure and a manufacturing method therefor, an oxide back plate and a display apparatus, which may allow that source and drain electrodes have a relatively high electrical conductivity and have little effect on the electrical performance of the oxide active layer.

In a first aspect, the present disclosure provides a thin film transistor, comprising:
  an oxide active layer;
  a source electrode and a drain electrode, the source electrode and the drain electrode connected to the oxide active layer, wherein
  the source electrode comprises a main portion and a connective portion, the main portion being isolated from the oxide active layer, and being electrically connected to the oxide active layer via the connective portion; and an electrical resistivity of the connective portion is greater than that of the main portion;
  the drain electrode comprises a main portion and a connective portion, the main portion being isolated from the oxide active layer, and being electrically connected to the oxide active layer via the connective portion; and an electrical resistivity of the connective portion is greater than that of the main portion.

Furthermore, the main portion comprises a first electrode layer and a second electrode layer laminated together; an electrical resistivity of the first electrode layer is greater than that of the second electrode layer; and the connective portion and the first electrode layer of the main portion are an integral structure formed through a same process.

Furthermore, the second electrode layer overlies an upper surface of the first electrode layer; the main portion further comprises a third electrode layer overlying an upper surface of the second electrode layer for guarding the second electrode layer.

Furthermore, a material of the first electrode layer and the connective portion includes Ti;
  and/or a material of the second electrode layer includes Cu;
  and/or a material of the third electrode layer includes Mo or MoNb.

Furthermore, the first electrode layer overlies an upper surface of the second electrode layer.

Furthermore, the oxide active layer is formed over the source electrode and the drain electrode, overlying a part of the connective portion of the source electrode and a part of the connective portion of the drain electrode.

In a second aspect, the present disclosure further provides a method for manufacturing a thin film transistor, comprising:
  forming an oxide active layer, a source electrode and a drain electrode, the source electrode and the drain electrode connected to the oxide active layer, wherein
  the source electrode comprises a main portion and a connective portion, the main portion being isolated from the oxide active layer, and being electrically connected to the oxide active layer via the connective portion; and an electrical resistivity of the connective portion is greater than that of the main portion;
  the drain electrode comprises a main portion and a connective portion, the main portion being isolated from the oxide active layer, and being electrically connected to the oxide active layer via the connective portion; and an electrical resistivity of the connective portion is greater than that of the main portion.

Furthermore, the step of forming the source electrode and the drain electrode comprises:
  forming a first electrode layer and the connective portion connected as an integral structure using a first conductive material through a same process, and forming a second electrode layer using a second conductive material, wherein the second electrode layer and the first electrode layer are laminated together to form the main portion, and an electrical resistivity of the first conductive material is greater than that of the second conductive material.

Furthermore, the step of forming a first electrode layer and the connective portion connected as an integral structure using a first conductive material through a same process, and forming a second electrode layer using a second conductive material comprises:

depositing a first conductive material layer, and depositing a second conductive material layer over the deposited first conductive material layer; and etching the second conductive material layer to form the second electrode layer, and then etching the first conductive material layer to form the first electrode layer and the connective portion, wherein, prior to etching the second conductive material layer to form the second electrode layer of the main portion, the method further comprises:

depositing a third conductive material layer over the second conductive material layer, and etching the third conductive material layer to form the third electrode layer for guarding the second electrode layer, wherein the third electrode layer, the first electrode layer and the second electrode layer are laminated together to form the main portion.

Furthermore, the first conductive material is Ti, the second conductive material is Cu, and the third conductive material is Mo or MoNb; and the step of etching the first conductive material layer to form the first electrode layer and the connective portion, etching the second conductive material layer to form the second electrode layer, and etching the third conductive material layer to form the third electrode layer comprises:

coating the third conductive material layer with a photoresist;

performing a half-exposure process once on the photoresist to form a photoresist completely-removed region, a photoresist completely-reserved region corresponding to the main portion, and a photoresist half-reserved region corresponding to the connective portion;

using a wet etching process to etch away the second conductive material layer and the third conductive material layer in the photoresist completely-removed region; and using a dry etching process to etch away the photoresist, the second conductive material layer and the third conductive material layer in the photoresist half-reserved region, and the first conductive material layer in the photoresist completely-removed region.

Furthermore, the step of forming a first electrode layer and the connective portion connected as an integral structure using a first conductive material through a same process and forming a second electrode layer using a second conductive material comprises:

depositing a second conductive material layer and etching the second conductive material layer to form the second electrode layer; and forming a first conductive material layer over the formed second electrode layer and etching the first conductive material layer to obtain the first electrode layer and the connective portion.

Furthermore, the step of forming an oxide active layer comprises:

forming the oxide active layer after the source electrode and the drain electrode are formed.

In a third aspect, the present disclosure further provides an oxide back plate, comprising a substrate and a thin film transistor array formed on the substrate, thin film transistors in the thin film transistor array being the thin film transistor above.

In a fourth aspect, the present disclosure further provides a display apparatus, comprising the oxide back plate above.

In the thin film transistor and the manufacturing method therefor, the oxide back plate and the display apparatus provided by the present disclosure, the source electrode comprises a main portion and a connective portion, the main portion being isolated from the oxide active layer, and being electrically connected to the oxide active layer via the connective portion, and the electrical resistivity of the connective portion is greater than that of the main portion; and the drain electrode comprises a main portion and a connective portion, the main portion being isolated from the oxide active layer, and being electrically connected to the oxide active layer via the connective portion, and the electrical resistivity of the connective portion is greater than that of the main portion. Since the main portions are not in contact with the oxide active layer, a metal with a relatively high electrical conductivity can be used as the source and drain electrodes, without having a great influence on the electrical performance of the oxide active layer.

BRIEF DESCRIPTION OF THE DRAWINGS

For the sake of illustrating the technical solutions of the embodiments of present disclosure more clearly, a brief introduction to drawings of the embodiments is made as follows. Apparently, the following drawings merely relate to some embodiments of present disclosure, and do not limit present disclosure.

DETAILED DESCRIPTION OF THE INVENTION

The technical solutions of the embodiments of the present disclosure will be described clearly and thoroughly hereinafter in conjunction with the drawings in respective embodiments in order to make the objects, technical solutions and advantages of the embodiments of the disclosure more clear. Obviously, the embodiments described are only some rather than all of the embodiments of the disclosure. All other embodiments obtained by one ordinary person skilled in the art based on the described embodiments in the disclosure without creative work are within the scope of the present disclosure.

First Embodiment

Figure 1:
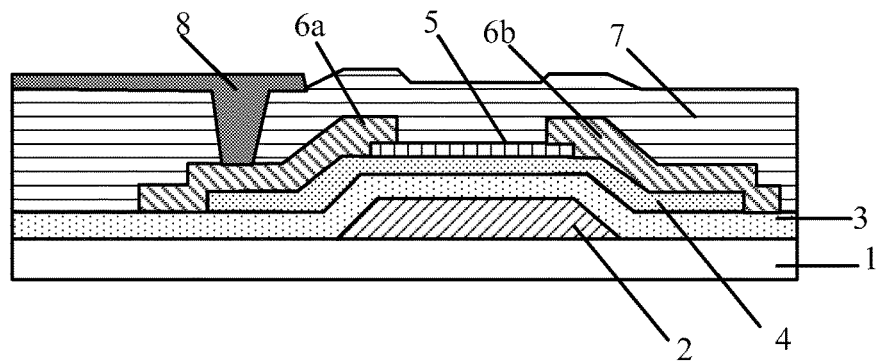
FIG. 1 is a structural schematic diagram of a thin film transistor in the prior art.
Figure 2:
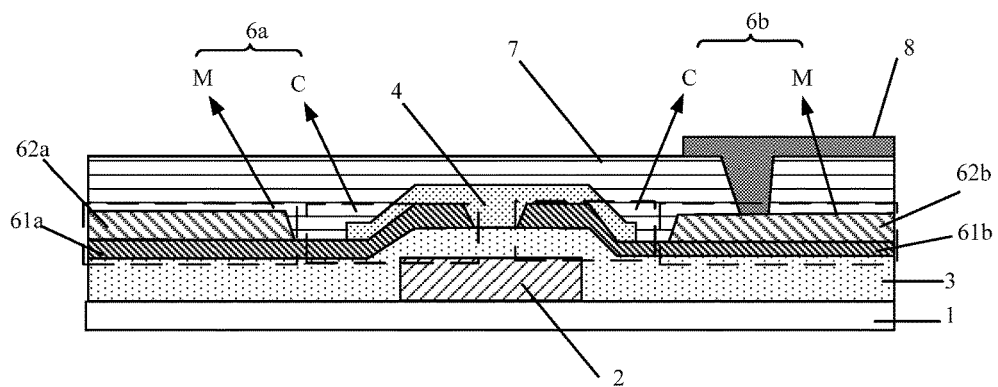
FIG. 2 is a cross-sectional schematic diagram of a structure of a thin film transistor provided in a first embodiment of the present disclosure.

Referring to FIG. 2, the structure of the thin film transistor provided in the first embodiment of the present disclosure comprises: a substrate 1, a gate electrode 2 formed on the substrate 1, a gate insulating layer 3 formed over the gate electrode 2, a source electrode 6a and a drain electrode 6b formed over the gate insulating layer 3, an oxide active layer 4 formed over the source and drain electrodes (i.e., the source electrode 6a and the drain electrode 6b), a passivation layer 7 formed over the source electrode 6a, the drain electrode 6b and the oxide active layer 4, and a pixel electrode 8 formed over the passivation layer 7, the pixel electrode 8 being connected with the drain electrode 6b through a via hole in the passivation layer 7.

As shown in FIG. 2, the source electrode 6a may be divided into two portions in the horizontal direction, i.e., a main portion M and a connective portion C. The main portion M is not in direct contact with the oxide active layer 4, but it is electrically connected with the oxide active layer 4 via the connective portion C. The main portion M includes a first electrode layer 61a and a second electrode layer 62a formed over the first electrode layer 61a. Here, the connective portion C is arranged in the same layer with the first electrode layer 61a, and they are an integral structure formed through a same process.

Similarly, the drain electrode 6b may also be divided into two portions in the horizontal direction, i.e., a main portion M and a connective portion C. The main portion M is not in direct contact with the oxide active layer 4, but it is electrically connected with the oxide active layer 4 via the connective portion C. The main portion M includes a first electrode layer 61b and a second electrode layer 62b formed over the first electrode layer 61b. Here, the connective portion C is arranged in the same layer with the first electrode layer 61b, and they are an integral structure formed through a same process.

In the first embodiment of the present disclosure, the oxide active layer 4 is formed above the connective portions of the source electrode 6a and the drain electrode 6b.

In the first embodiment of the present disclosure, as the main portion M of the source electrode 6a and the main portion M of the drain electrode 6b are not in direct contact with the oxide active layer 4, a material with a relatively high electrical conductivity may be used to make the main portions M, while a material with a relatively low electrical conductivity may be used to make the connective portions C. Thus, it may not only make the source and drain electrodes as a whole have a relatively high electrical conductivity, but also avoid the conductive particles in the main portions M from entering the oxide active layer and affecting the electrical performance of the oxide active layer.

In addition, in this embodiment of the present disclosure, the connective portion C and the first electrode layer 61a are arranged in a same layer, and they are an integral structure formed through a same process. Advantages of such an arrangement include, on one hand, that it may ensure the main portion and the connective portion can be connected well and prevent from connection failure, and on the other hand, that the difficulty of manufacturing a thin film transistor may be reduced greatly since the first electrode layer and the connective portion are formed through a same process. Certainly, in practical applications, the connective portion C and the first electrode layer 61a are not necessary to be arranged in a same layer, and are not necessary to be arranged as an integral structure formed through a same process. For example, the connective portion C may be manufactured separately, and the connective portion C is connected between the second electrode layer and the oxide active layer; this arrangement can also solve the essential problem to be solved by the present disclosure, and the corresponding technical solution shall also fall into the protection scope of the present disclosure. It is not difficult to understand that, when the connective portion C is manufactured separately, the main portion as a whole may be manufactured using a material with a relatively high electrical conductivity, with no need to utilize a composite layer manufactured to include the first electrode layer and the second electrode layer.

In addition, in the first embodiment of the present disclosure, as the oxide active layer 4 is formed above the connective portion in the source electrode 6a and the drain electrode 6b, in the process of manufacturing such a thin film transistor, the source electrode 6a and the drain electrode 6b is manufactured first, and then the oxide active layer 4 is manufactured. Thus, in the process of etching to form the source electrode 6a and the drain electrode 6b, it is unnecessary to shield the oxide active layer, and thus it is unnecessary to arrange an etching barrier layer. In this way, not only complexity of the manufacturing process but also the thickness of the thin film transistor is reduced, which facilitates the lightening and thinning of the corresponding product. Certainly, in practical applications, unlike in the first embodiment, the oxide active layer may be first formed, and then the source and drain electrodes are formed over the oxide active layer. In this case, the connective portion may be formed first to be in contact with the oxide active layer, and then the main portion is formed over the connective portion. As the oxide active layer is located below the connective portion and the main portion is located above the connective portion, the area of the main portion may be consistent with that of the connective portion.

In specific implementation, for example, a material of the second electrode layers 62a and 62b may include copper. Furthermore, a material of the first electrode layers 61a and 61b and the connective portions C may include a metal such as Ti.

Second Embodiment

Figure 3:
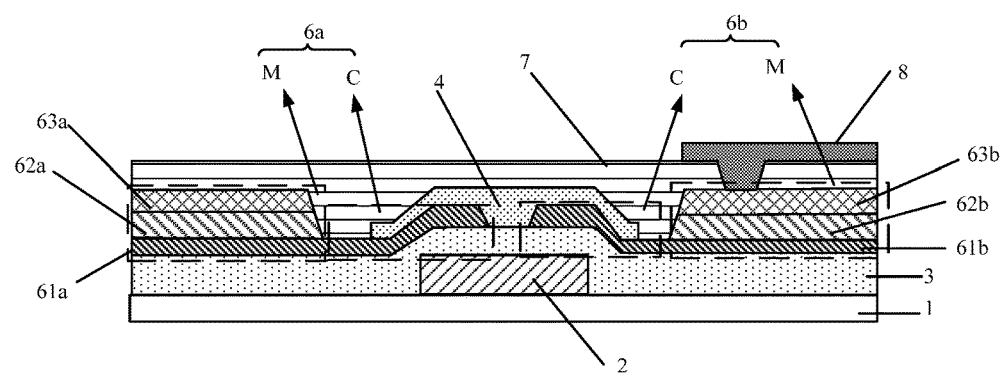
FIG. 3 is a cross-sectional schematic diagram of a structure of a thin film transistor provided in a second embodiment of the present disclosure.

Referring to FIG. 3, unlike the first embodiment, in the thin film transistor provided in the second embodiment of the present disclosure, the main portions of the source electrode 6a and the drain electrode 6b both include three electrode layers. The main portion of the source electrode 6a further includes a third electrode layer 63a formed over the second electrode layer 62a, and the main portion of the drain electrode 6b further includes a third electrode layer 63b formed over the second electrode layer 62b. Therein, the third electrode layers 63a and 63b are made using a material that is suitable for preventing the second electrode layers 62a and 62b from being corroded so as to guard the second electrode layers. In this case, the third electrode layer 63b in the drain electrode 6b is in contact with the pixel electrode 8, whereas the second electrode layer 62b is not in direct contact with the pixel electrode 8.

Besides solving the essential problem to be solved by the present disclosure, the arrangement of the second embodiment of the present disclosure can avoid the corrosion of the second electrode layer 62b during the process of manufacturing the passivation layer and the pixel electrode and can prevent the pixel electrode from reacting with the second electrode layer 62b and corroding the second electrode layer 62b during the process of subsequent usage.

In specific implementation, for example, the third electrode layers 63a and 63b here may be made using Mo or MoNb.

Third Embodiment

Figure 4:
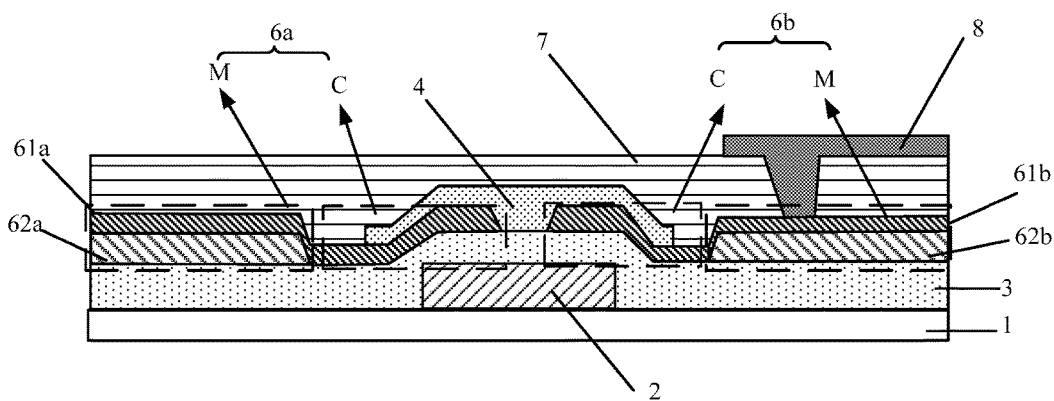
FIG. 4 is a cross-sectional schematic diagram of a structure of a thin film transistor provided in a third embodiment of the present disclosure.

Referring to FIG. 4, unlike the first embodiment, in the thin film transistor provided in the third embodiment of the present disclosure, the second electrode layers 62a and 62b are directly formed over the gate insulating layer 3, and the first electrode layers 61a and 61b overlie the second electrode layers 62a and 62b. The pixel electrode 8 is connected with the drain electrode 6b directly via the first electrode layer 61b.

Besides solving the essential problem to be solved by the present disclosure, the arrangement of the third embodiment of the present disclosure can further avoid the corrosion on the second electrode layer 62b during the process of manufacturing the passivation layer and the pixel electrode and can prevent the pixel electrode from reacting with the second electrode layer 62b and corroding the second electrode layer 62b during the process of subsequent usage. Moreover, as compared with the solution of the second embodiment, the number of the electrode layers is reduced by one.

Fourth Embodiment

Figure 5:
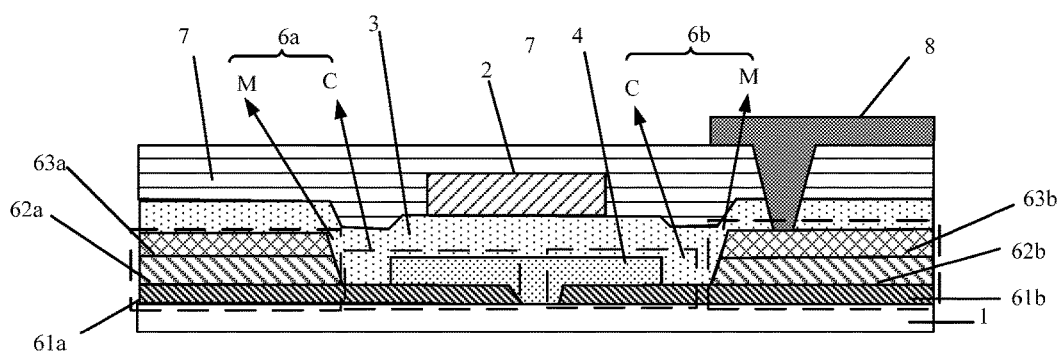
FIG. 5 is a cross-sectional schematic diagram of a structure of a thin film transistor provided in a fourth embodiment of the present disclosure.

Referring to FIG. 5, unlike the second embodiment, the thin film transistor provided in the fourth embodiment of the present disclosure comprises: a substrate 1, a source electrode 6a and a drain electrode 6b formed over the substrate 1, an oxide active layer 4 formed over the source and drain electrodes 6a and 6b and the substrate 1, a gate insulating layer 3 formed over the source electrode 6a and the drain electrode 6b and the oxide active layer 4, a gate electrode 2 formed over the gate insulating layer 3, a passivation layer 7 formed over the gate electrode 2, and a pixel electrode 8 formed over the passivation layer 7, the gate insulating layer 3 and the passivation layer 7 having via holes formed therein, the pixel electrode 8 being connected with the drain electrode 6b through the via holes in the gate insulating layer 3 and the passivation layer 7.

The thin film transistor provided in the fourth embodiment of the present disclosure can also solve the essential problem to be solved by the present disclosure. It can be seen from the first embodiment in conjunction with the fourth embodiment that the implementation of the present disclosure is not affected whether the thin film transistor is of a top gate type or of a bottom gate type, and both of the corresponding technical solutions fall into the protection scope of the present disclosure.

On the other hand, the present disclosure further provides a method for manufacturing a thin film transistor, which may be used for manufacturing the thin film transistor according to any one of the first to fourth embodiments above, comprising:

forming an oxide active layer, a source electrode and a drain electrode, the source electrode and the drain electrode connected to the oxide active layer, wherein the source electrode comprises a main portion and a connective portion, the main portion being isolated from the oxide active layer, and being electrically connected to the oxide active layer via the connective portion; and an electrical resistivity of the connective portion is greater than that of the main portion;

the drain electrode comprises a main portion and a connective portion, the main portion being isolated from the oxide active layer, and being electrically connected to the oxide active layer via the connective portion; and an electrical resistivity of the connective portion is greater than that of the main portion.

In the thin film transistor manufactured by the method for manufacturing a thin film transistor provided in the present disclosure, the source electrode comprises a main portion and a connective portion, the main portion is isolated from the active layer, and is electrically connected to the active layer via the connective portion, and the electrical resistivity of the connective portion is greater than that of the main portion; and the drain electrode comprises a main portion and a connective portion, the main portion being isolated from the oxide active layer, and being electrically connected to the oxide active layer via the connective portion; and an electrical resistivity of the connective portion is greater than that of the main portion. As the main portion is not in contact with the oxide active layer, a metal with a relatively high electrical conductivity may be used as the source and drain electrodes, without having a great impact on the electrical performance of the active layer.

Specifically, when the thin film transistor to be manufactured is a thin film transistor according to any one of the first to fourth embodiments, in the method above, the step of forming the source electrode and the drain electrode comprises:

forming a first electrode layer and the connective portion connected as an integral structure using a first conductive material through a same process; and forming a second electrode layer using a second conductive material, wherein the second electrode layer and the first electrode layer are laminated together to form the main portion, and an electrical resistivity of the first conductive material is greater than that of the second conductive material.

Furthermore, when the thin film transistor to be manufactured is a thin film transistor according to the first, second and fourth embodiments above, the step of forming a first electrode layer and the connective portion connected as an integral structure using a first conductive material through a same process, and forming a second electrode layer using a second conductive material may comprise:

depositing a first conductive material layer, and depositing a second conductive material layer over the deposited first conductive material layer; and etching the second conductive material layer to form the second electrode layer, and then etching the first conductive material layer to form the first electrode layer and the connective portion.

Furthermore, when the thin film transistor to be manufactured is a thin film transistor according to the second and fourth embodiments, prior to etching the second conductive material layer to form the second electrode layer of the main portion, the method may further comprise:

depositing a third conductive material layer over the second conductive material layer; and etching the third conductive material layer to form the third electrode layer for guarding the second electrode layer, wherein the third electrode layer, the first electrode layer and the second electrode layer are laminated together to form the main portion.

Figure 6:
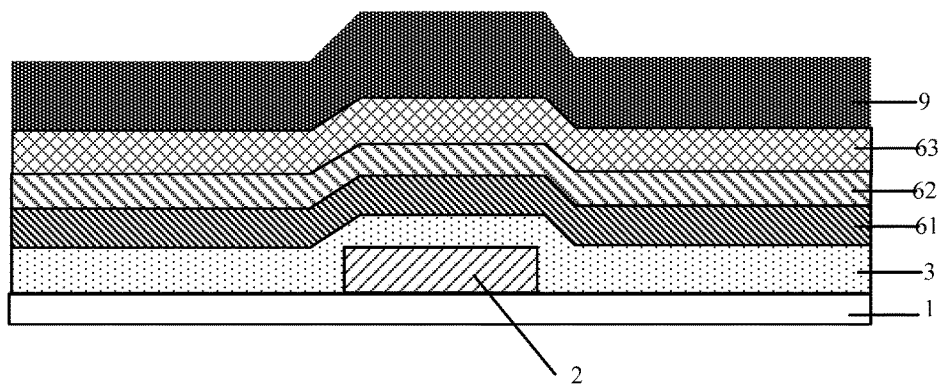
FIGS. 6-9 are schematic diagrams of respective stages of manufacturing the source and drain electrodes in FIG. 3.
Figure 7:
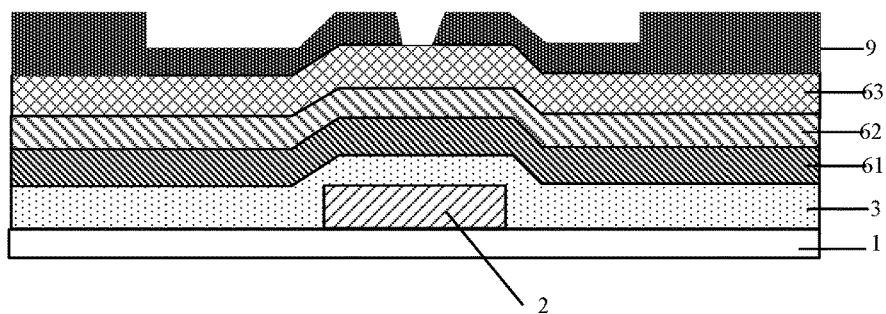
Figure 8:
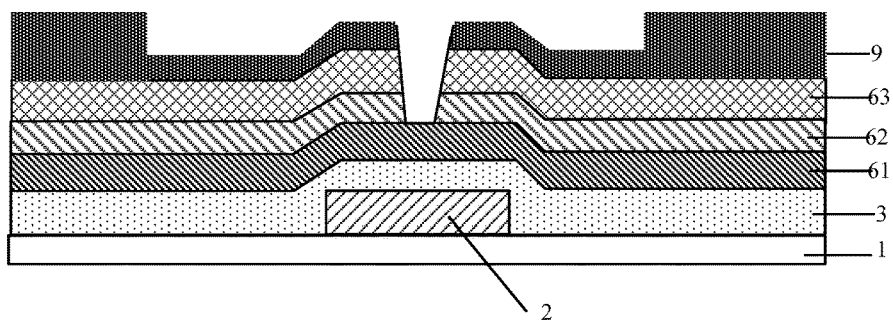

Furthermore, the first conductive material may be Ti, the second conductive material may be Cu, and the third conductive material may be Mo or MoNb; in this case, the step of etching the first conductive material layer to form the first electrode layer and connective portion, etching the second conductive material layer to form the second electrode layer, and etching the third conductive material layer to form the third electrode layer may, referring to FIGS. 6-8 (assuming that a thin film transistor as shown in FIG. 3 is to be manufactured), comprise:

referring to FIG. 6, coating the third conductive material layer (indicated by 63 in the figure) with a photoresist 9;

referring to FIG. 7, performing a half-exposure process once on the photoresist 9 to form a photoresist completely-removed region, a photoresist completely-reserved region corresponding to the main portion, and a photoresist half-reserved region corresponding to the connective portion;

referring to FIG. 8, using a wet etching process to etch away the second conductive material layer (indicated by 62 in the figure) and the third conductive material layer in the photoresist completely-removed region.

Specifically, an etching solution, which is capable of etching the third conductive material and the second conductive material but cannot etch the first conductive material, may be used to etch away the second conductive material layer and the third conductive material layer in the completely-removed region while reserving the first conductive material layer (indicated by 61 in the figure) in this region.

Figure 9:
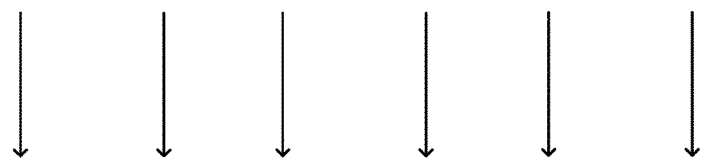
Figure 9:
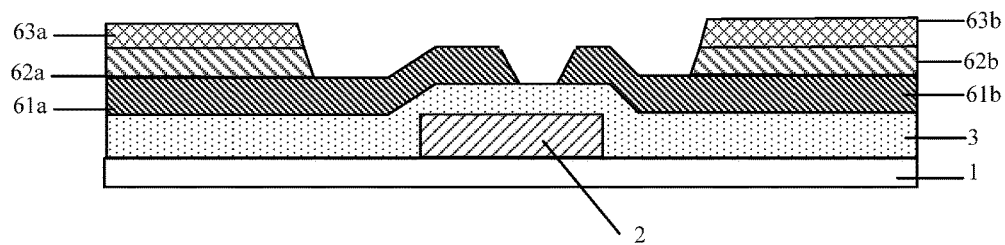

Referring to FIG. 9, a dry etching process is used to etch away the photoresist, the second conductive material layer and the third conductive material layer in the photoresist half-reserved region, and the first conductive material layer in the photoresist completely-removed region. Since the photoresist completely-removed region is not shielded, the first conductive material in the photoresist completely-removed region will be fully etched; the thickness of the photoresist of the photoresist half-reserved region is small, therefore the second conductive material layer and the third conductive material layer will be etched after the photoresist is fully etched away, so that the second conductive material layer and the third conductive material layer in this region are etched away; as for the photoresist completely-reserved region, the thickness of the photoresist is large, therefore in the etching process, neither the second conductive material layer nor the third conductive material layer will be etched, and finally the second electrode layer and the third electrode layer are formed.

Thus, the source electrode including a three-layer structure and the drain electrodes are formed by using only one exposure process, which reduces complexity of the manufacturing process.

In addition, when the method above is used for manufacturing the thin film transistor in the third embodiment, the step of forming a first electrode layer and the connective portion connected as an integral structure using a first conductive material through a same process and forming a second electrode layer using a second conductive material may comprise:

depositing a second conductive material layer and etching the second conductive material layer to form the second electrode layer; and forming a first conductive material layer over the formed second electrode layer and etching the first conductive material layer to form the first electrode layer and the connective portion.

In specific implementation, in the manufacturing method provided in the present disclosure, the oxide active layer may be formed after the source electrode and the drain electrode are formed. Thus, in the process of etching to form the source electrode and the drain electrode, it is unnecessary to shield the oxide active layer, and thus it is unnecessary to form an etching barrier layer. This not only reduces complexity of the manufacturing process, but also reduces the thickness of the thin film transistor, which facilitates lightening and thinning of the corresponding product.

Figure 10:
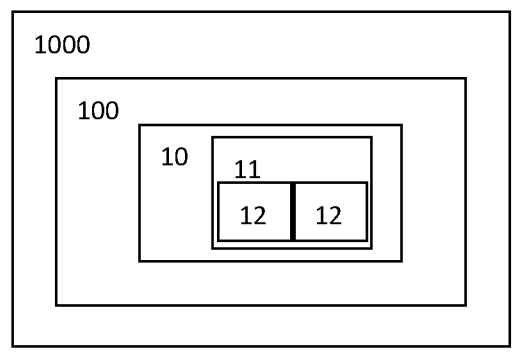
FIG. 10 is a schematic diagram of a display apparatus comprising an oxide back plate, the oxide back plate comprising a thin film transistor array, thin film transistors in the thin film transistor array being the thin film transistor provided in the present disclosure.

In a third aspect, the present disclosure further provides an oxide back plate 100, as shown in FIG. 10, comprising a substrate 10 and a thin film transistor array 11 formed on the substrate 10, thin film transistors 12 in the thin film transistor array 11 being the thin film transistor according to any one technical solution in the first aspect above. In FIG. 10, two thin film transistors 12 are shown. However, the number of the thin film transistors 12 is not limited, and there may be any number of the thin film transistors 12 in the thin film transistor array 11 as required.

In a fourth aspect, referring to FIG. 10, the present disclosure further provides a display apparatus 1000, comprising the oxide back plate 100 above. The display apparatus 1000 may concretely be an apparatus that has a display function, such as a tablet computer, a mobile phone, an WAD, electronic paper, or the like.

The forgoing implementations are merely illustrative implementations of the present disclosure. However, the protection scope of the present disclosure is not limited thereto. Any change or substitution that may be envisaged by a person of ordinary skill in the art without departing from the technical scope disclosed by the present disclosure should be considered to be encompassed in the protection scope of the present disclosure. Therefore, the protection scope of the present disclosure is defined by the appended claims.

The invention claimed is:

1. A thin film transistor comprising:
an oxide active layer, a source electrode and a drain electrode, the source electrode and the drain electrode connected to the oxide active layer, wherein:
the source electrode is composed of a main portion and a connective portion, the main portion of the source electrode being isolated from the oxide active layer and electrically connected to the oxide active layer via the connective portion of the source electrode, an electrical resistivity of the connective portion of the source electrode is greater than that of the main portion of the source electrode, and a projection of the connective portion of the source electrode in a direction perpendicular to a main surface of the thin film transistor does not overlap a projection of the main portion of the source electrode in the direction; and
the drain electrode is composed of a main portion and a connective portion, the main portion of the drain electrode being isolated from the oxide active layer and electrically connected to the oxide active layer via the connective portion of the drain electrode, an electrical resistivity of the connective portion of the drain electrode is greater than that of the main portion of the drain electrode, and a projection of the connective portion of the drain electrode in the direction perpendicular to the main surface of the thin film transistor does not overlap a projection of the main portion of the drain electrode in the direction.

2. The thin film transistor according to claim 1, wherein the oxide active layer is disposed over the source electrode and the drain electrode, and overlies a part of the connective portion of the source electrode and a part of the connective portion of the drain electrode.

3. An oxide back plate, comprising a substrate and a thin film transistor array disposed on the substrate, thin film transistors in the thin film transistor array being the thin film transistor according to claim 1.

4. A display apparatus, comprising the oxide back plate according to claim 3.

5. The thin film transistor according to claim 1, wherein the main portion of the source electrode comprises a first electrode layer and a second electrode layer laminated together, wherein an electrical resistivity of the first electrode layer of the source electrode is greater than that of the second electrode layer of the source electrode, wherein the connective portion of the source electrode and the first electrode layer of the source electrode are an integral structure, wherein the main portion of the drain electrode comprises a first electrode layer and a second electrode layer laminated together, wherein an electrical resistivity of the first electrode layer of the drain electrode is greater than that of the second electrode layer of the drain electrode, and wherein the connective portion of the drain electrode and the first electrode layer of the drain electrode are an integral structure.

6. An oxide back plate, comprising a substrate and a thin film transistor array disposed on the substrate, thin film transistors in the thin film transistor array being the thin film transistor according to claim 5.

7. The thin film transistor according to claim 5, wherein the first electrode layer of the source electrode overlies an upper surface of the second electrode layer of the source electrode and wherein the first electrode layer of the drain electrode overlies an upper surface of the second electrode layer of the drain electrode.

8. The thin film transistor according to claim 5, wherein the oxide active layer is disposed over the source electrode and the drain electrode, and overlies a part of the connective portion of the source electrode and a part of the connective portion of the drain electrode.

9. The thin film transistor according to claim 5, wherein the second electrode layer of the source electrode overlies an upper surface of the first electrode layer of the source electrode, wherein the main portion of the source electrode further comprises a third electrode layer overlying an upper surface of the second electrode layer of the source electrode for guarding the second electrode layer of the source electrode, wherein the second electrode layer of the drain electrode overlies an upper surface of the first electrode layer of the drain electrode, wherein the main portion of the drain electrode comprises a third electrode layer overlying an upper surface of the second electrode layer of the drain electrode for guarding the second electrode layer of the drain electrode.

10. The thin film transistor according to claim 9, wherein:
a material of the first electrode layer of the source electrode and the connective portion of the source electrode includes Ti, and/or a material of the second electrode layer of the source electrode includes Cu, and/or a material of the third electrode layer of the source electrode includes Mo or MoNb; and
a material of the first electrode layer of the drain electrode and the connective portion of the drain electrode includes Ti, and/or a material of the second electrode layer of the drain electrode includes Cu, and/or a material of the third electrode layer of the drain electrode includes Mo or MoNb.

11. The thin film transistor according to claim 9, wherein the oxide active layer is disposed over the source electrode and the drain electrode, and overlies a part of the connective portion of the source electrode and a part of the connective portion of the drain electrode.

12. An oxide back plate, comprising a substrate and a thin film transistor array formed on the substrate, thin film transistors in the thin film transistor array being the thin film transistor according to claim 9.

13. A method for manufacturing a thin film transistor, the method comprising:
forming an oxide active layer, a source electrode and a drain electrode, the source electrode and the drain electrode connected to the oxide active layer, wherein:
the source electrode is composed of a main portion and a connective portion, the main portion of the source electrode being isolated from the oxide active layer and electrically connected to the oxide active layer via the connective portion of the source electrode, an electrical resistivity of the connective portion of the source electrode is greater than that of the main portion of the source electrode, and a projection of the connective portion of the source electrode in a direction perpendicular to a main surface of the thin film transistor does not overlap a projection of the main portion of the source electrode in the direction; and
the drain electrode is composed of a main portion and a connective portion, the main portion of the drain electrode being isolated from the oxide active layer and electrically connected to the oxide active layer via the connective portion of the drain electrode, an electrical resistivity of the connective portion of the drain electrode is greater than that of the main portion of the drain electrode, and a projection of the connective portion of the drain electrode in the direction perpendicular to the main surface of the thin film transistor does not overlap a projection of the main portion of the drain electrode in the direction.

14. The method according to claim 13, wherein forming the oxide active layer comprises:
forming the oxide active layer after the source electrode and the drain electrode are formed.

15. The method according to claim 13, wherein forming the source electrode and the drain electrode comprises forming a first electrode layer of the source electrode and of the drain electrode and the connective portion of the source electrode and of the drain electrode connected as an integral structure using a first conductive material through a same process, and forming a second electrode layer of the source electrode and of the drain electrode using a second conductive material, wherein the second electrode layer of the source electrode and of the drain electrode and the first electrode layer of the source electrode and of the drain electrode are laminated together to form the main portion of the source electrode and of the drain electrode, and wherein an electrical resistivity of the first conductive material is greater than that of the second conductive material.

16. The method according to claim 15, wherein forming the first electrode layer of the source electrode and of the drain electrode and the connective portion of the source electrode and of the drain electrode and forming the second electrode layer of the source electrode and of the drain electrode comprises:

depositing a second conductive material layer and etching the second conductive material layer to form the second electrode layer of the source electrode and of the drain electrode; and forming a first conductive material layer over the formed second electrode layer of the source electrode and of the drain electrode and etching the first conductive material layer to obtain the first electrode layer and the connective portion of the source electrode and of the drain electrode.

17. The method according to claim 15, wherein forming the oxide active layer comprises:

forming the oxide active layer after the source electrode and the drain electrode are formed.

18. The method according to claim 15, wherein forming the first electrode layer of the source electrode and of the drain electrode and the connective portion of the source electrode and of the drain electrode, and forming the second electrode layer of the source electrode and of the drain electrode comprises:

depositing a first conductive material layer, and depositing a second conductive material layer over the deposited first conductive material layer; and etching the second conductive material layer to form the second electrode layer of the source electrode and of the drain electrode, and then etching the first conductive material layer to form the first electrode layer of the source electrode and of the drain electrode and the connective portion of the source electrode and of the drain electrode, wherein, prior to etching the second conductive material layer to form the second electrode layer of the main portion of the source electrode and of the drain electrode, the method further comprises:

depositing a third conductive material layer over the second conductive material layer; and etching the third conductive material layer to form a third electrode layer of the source electrode and of the drain electrode for guarding the second electrode layer of the source electrode and of the drain electrode, wherein the third electrode layer of the source electrode and of the drain electrode, the first electrode layer of the source electrode and of the drain electrode, and the second electrode layer of the source electrode and of the drain electrode are laminated together to form the main portion of the source electrode and of the drain electrode.

19. The method according to claim 18, wherein the first conductive material is Ti, the second conductive material is Cu, and the third conductive material is Mo or MoNb; and wherein etching the first conductive material layer to form the first electrode layer of the source electrode and of the drain electrode and the connective portion of the source electrode and of the drain electrode, etching the second conductive material layer to form the second electrode layer of the source electrode and of the drain electrode, and etching the third conductive material layer to form the third electrode layer of the source electrode and of the drain electrode comprises:

coating the third conductive material layer with a photoresist;

performing a half-exposure process once on the photoresist to form a photoresist completely-removed region, a photoresist completely-reserved region corresponding to the main portion of the source electrode and of the drain electrode, and a photoresist half-reserved region corresponding to the connective portion of the source electrode and of the drain electrode;

using a wet etching process to etch away the second conductive material layer and the third conductive material layer in the photoresist completely-removed region; and using a dry etching process to etch away the photoresist, the second conductive material layer and the third conductive material layer in the photoresist half-reserved region, and the first conductive material layer in the photoresist completely-removed region.

20. The method according to claim 18, wherein forming the oxide active layer comprises:

forming the oxide active layer after the source electrode and the drain electrode are formed.

* * * * *